(12) United States Patent
Lee et al.

(10) Patent No.: US 9,142,454 B1
(45) Date of Patent: Sep. 22, 2015

(54) SEMICONDUCTOR STRUCTURE AND METHOD FOR MANUFACTURING THE SAME

(71) Applicant: Macronix International Co., Ltd., Hsinchu (TW)

(72) Inventors: Guan-Ru Lee, Kaohsiung (TW); Yu-Wei Jiang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/215,149

(22) Filed: Mar. 17, 2014

(51) Int. Cl.
*H01L 21/44* (2006.01)
*H01L 21/768* (2006.01)
*H01L 23/48* (2006.01)

(52) U.S. Cl.
CPC .... *H01L 21/76877* (2013.01); *H01L 21/76802* (2013.01); *H01L 23/481* (2013.01)

(58) Field of Classification Search
CPC ................................................ H01L 21/76816

USPC .......................................... 438/667; 257/758
See application file for complete search history.

(56) References Cited

U.S. PATENT DOCUMENTS

| | | | |
|---|---|---|---|
| 2007/0117372 A1* | 5/2007 | Hsu et al. ...................... | 438/622 |
| 2012/0199970 A1* | 8/2012 | Yun et al. ...................... | 257/737 |
| 2013/0196506 A1* | 8/2013 | Kosub .......................... | 438/667 |

* cited by examiner

*Primary Examiner* — Bradley K Smith
(74) *Attorney, Agent, or Firm* — McClure, Qualey & Rodack, LLP

(57) ABSTRACT

A semiconductor structure and a method for manufacturing the same are disclosed. The semiconductor structure includes a substrate, a first conductive structure, a second conductive structure, a dielectric structure, a dielectric layer, a first conductive plug, and a second conductive plug. The first conductive plug passes through only an upper dielectric portion of the dielectric structure, the dielectric layer and a lower dielectric portion of the dielectric structure to physically and electrically contact with the first conductive structure. The second conductive plug passes through the upper dielectric portion, the dielectric layer and the lower dielectric portion to physically and electrically contact with the second conductive structure.

19 Claims, 5 Drawing Sheets

SEMICONDUCTOR STRUCTURE AND METHOD FOR MANUFACTURING THE SAME

BACKGROUND

1. Technical Field

The invention relates to a semiconductor structure and a method for manufacturing the same are disclosed and more specifically to a semiconductor structure including a conductive plug and a method for manufacturing the same.

2. Description of the Related Art

Semiconductor structures include memory devices, used in storage elements for many products such as MP3 players, digital cameras, computer files, etc. As the application increases, the demand for the memory device focuses on small size and large memory capacity. For satisfying the requirement, a memory having a high element density is need.

Designers have developed a method for improving a memory device density, using 3D stack memory device so as to increase a memory capacity and a cost per cell. However, complex structures of a memory device make manufacturing processes complicated.

SUMMARY

According to one embodiment, a method for manufacturing a semiconductor structure is disclosed. The method comprises following steps. A first conductive structure is formed on a substrate. A second conductive structure is formed on the substrate and has a material different from a material of an upper conductive portion of the first conductive structure. A lower dielectric portion of a dielectric structure is formed on the first conductive structure and the second conductive structure. A dielectric layer is formed on the lower dielectric portion. An upper dielectric portion of the dielectric structure is formed on the dielectric layer having a material different from materials of the upper dielectric portion and the lower dielectric portion. A first conductive plug is formed to pass through only the upper dielectric portion, the dielectric layer and the lower dielectric portion to physically and electrically contact with the first conductive structure. A second conductive plug is formed to pass through the upper dielectric portion, the dielectric layer and the lower dielectric portion to physically and electrically contact with the second conductive structure.

According to another embodiment, a semiconductor structure is disclosed, comprising a substrate, a first conductive structure, a second conductive structure, a dielectric structure, a dielectric layer, a first conductive plug, and a second conductive plug. The first conductive structure is on the substrate. The second conductive structure is on the substrate and has a material different from an upper conductive portion of the first conductive structure. The dielectric structure comprises an upper dielectric portion and a lower dielectric portion. The dielectric layer is between the upper dielectric portion and the lower dielectric portion, and has a material different from materials of the upper dielectric portion and the lower dielectric portion. The first conductive plug passes through only the upper dielectric portion, the dielectric layer and the lower dielectric portion to physically and electrically contact with the first conductive structure. The second conductive plug passes through the upper dielectric portion, the dielectric layer and the lower dielectric portion to physically and electrically contact with the second conductive structure.

DETAILED DESCRIPTION

FIG. 1A to FIG. 1H illustrate a method for manufacturing a semiconductor structure according to an embodiment.

Figure 1A:
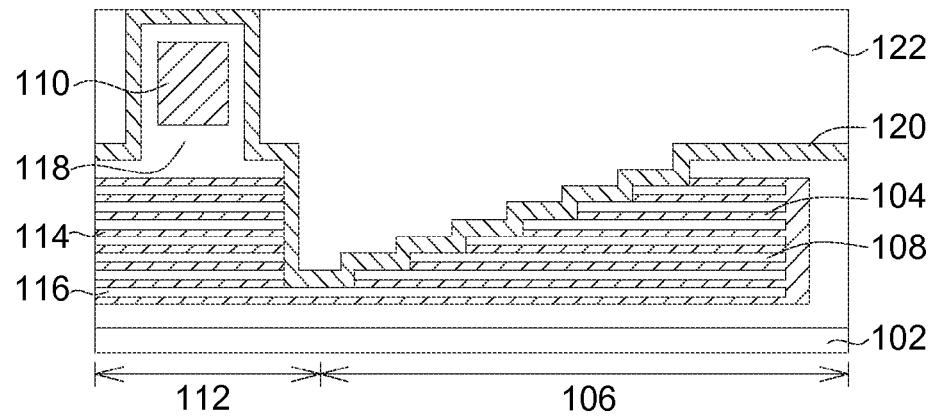
FIG. 1A to FIG. 1H illustrate a method for manufacturing a semiconductor structure according to an embodiment.

Referring to FIG. 1A, a substrate 102 is provided. The substrate 102 may comprise a silicon substrate, such as polysilicon, or other suitable semiconductor substrates. A first conductive structure 104 is formed on the substrate 102 in a first circuit region 106. A lower dielectric portion 108 is formed on the first conductive structure 104. In one embodiment, the first conductive structure 104 comprises conductive stair of different levels, separated form each other by the lower dielectric portion 108. In one embodiment, the conductive stairs of the first conductive structure 104 comprise (un-metalized) polysilicon material.

A silicon-containing structure 110 is formed on the substrate 102 in a second circuit region 112. In one embodiment, the silicon-containing structure 110 comprises polysilicon. The silicon-containing structure 110 may be formed over the conductive strips 114 and dielectric strips 116 stacked alternately of a 3D stacked memory, and separated from the conductive strips 114 and the dielectric strips 116 by an insulating material 118. In one embodiment, the conductive stairs of the first conductive structure 104 and the conductive strips 114 of the second circuit region 112 may be arranged in the same level, and the silicon-containing structure 110 may be disposed higher than the first conductive structure 104.

A first etching stop layer 120 is formed to cover the lower dielectric portion 108 in the first circuit region 106 and the insulating material 118 on the silicon-containing structure 110 in the second circuit region 112. A dielectric material is formed on the first etching stop layer 120 to form an upper dielectric portion 122 in the first circuit region 106. In one embodiment, for example, the dielectric material is planarized by a CMP process stopping on the first etching stop layer 120.

Figure 1B:
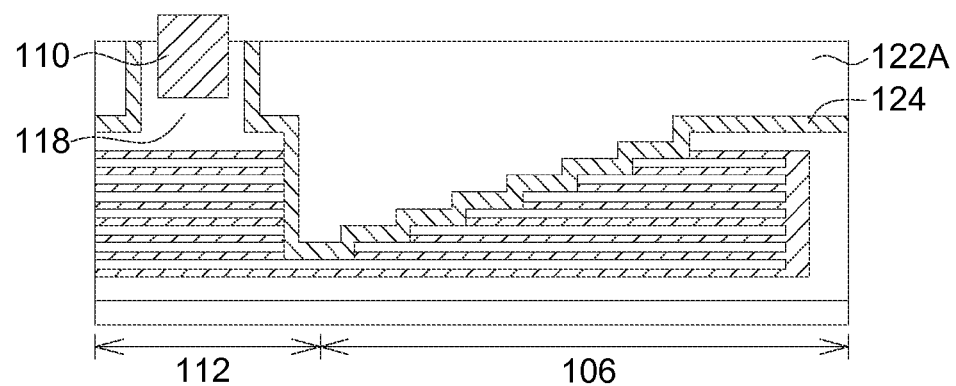
Figure 1C:
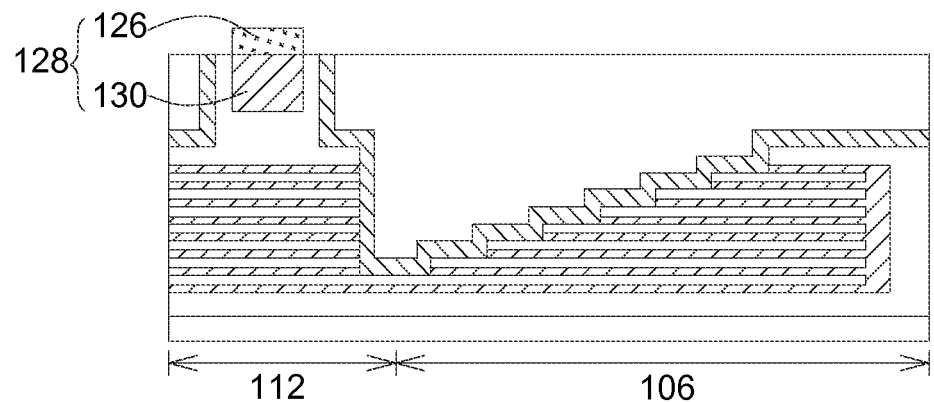

Referring to FIG. 1B, portions of the upper dielectric portion 122 (FIG. 1A), the first etching stop layer 120 (FIG. 1A) and the insulating material 118 may be removed by an etching step, to expose an upper portion of the silicon-containing structure 110, and remain the first etching stop layer 120 in the first circuit region 106 to form a dielectric layer 124 under the upper dielectric portion 122A.

Referring to FIG. 1O, the exposed upper portion of the silicon-containing structure 110 (FIG. 1B) is metalized so as to form an upper conductive portion 126 comprising a metal silicide. Therefore, a formed second conductive structure 128 comprises the upper conductive portion 126 and a lower conductive portion 130, wherein the lower conductive portion 130 maintains comprising the (un-metalized) polysilicon material as the silicon-containing structure 110. The second conductive structure 128 is not limited to be a gate structure of a MOS, and can be a source or a drain of the MOS, or other contact structures.

Figure 1D:
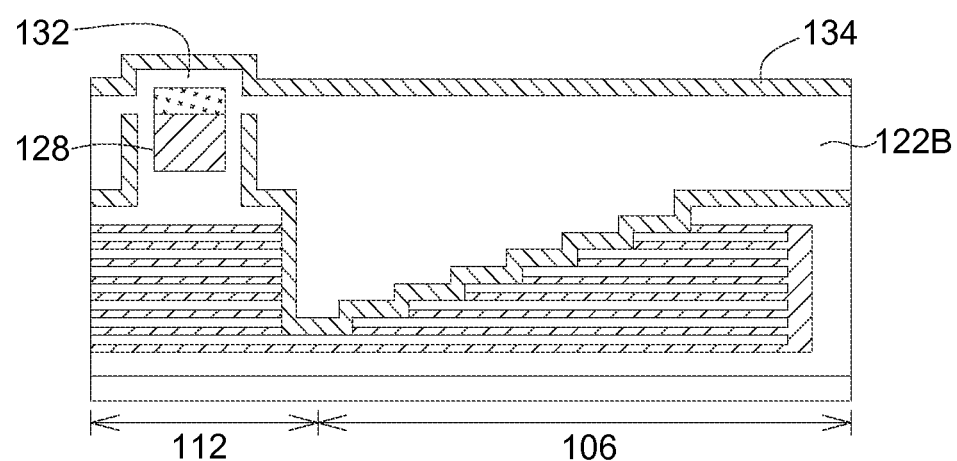

Referring to FIG. 1D, a dielectric material is formed in the first circuit region 106 and the second circuit region 112, to form a lower dielectric portion 132 covering the second conductive structure 128, and form the upper dielectric portion 122B. A second etching stop layer 134 is formed to cover the upper dielectric portion 122B in the first circuit region 106 and the lower dielectric portion 132 in the second circuit region 112.

Figure 1E:
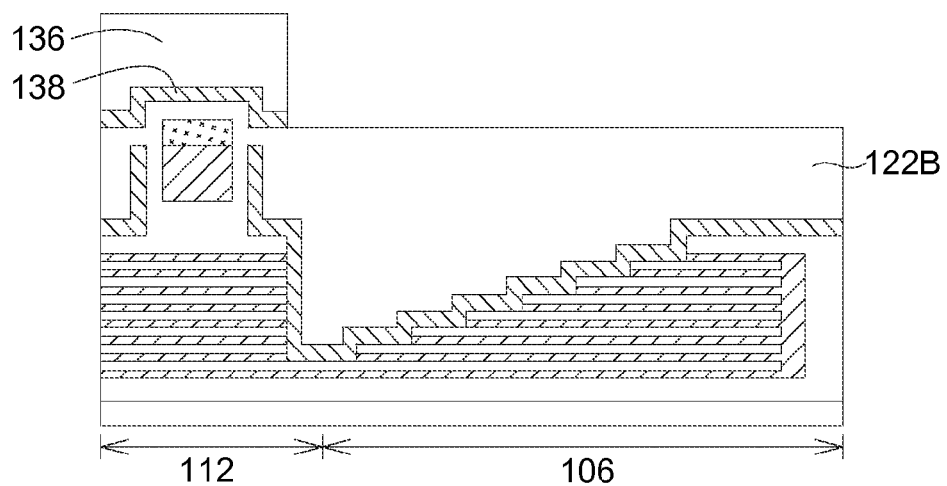
Figure 1F:
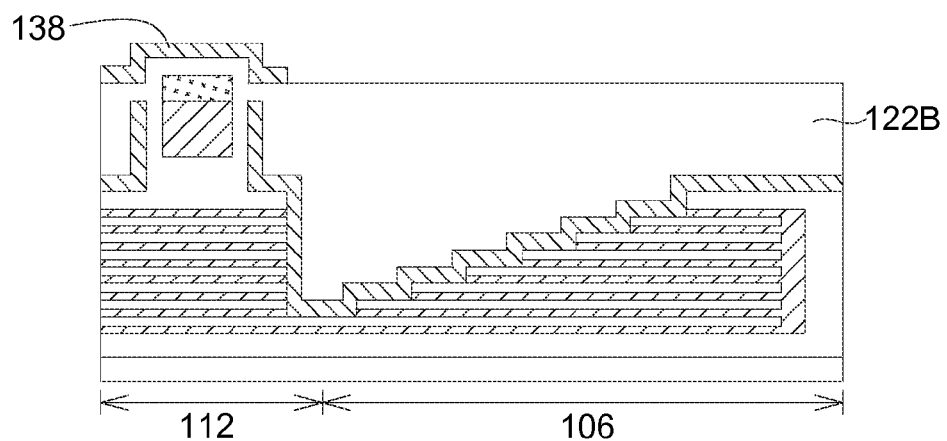

Referring to FIG. 1E, a patterned mask 136 is formed on the second etching stop layer 134 (FIG. 1D) in the second circuit region 112. An un-covered portion of the second etching stop layer 134 in the first circuit region 106 is removed by an etching process. The remained portion of the second etching stop layer 134 by the etching process forms a dielectric layer 138. The patterned mask 136 is removed to form the structure as shown in FIG. 1F.

Figure 1G:
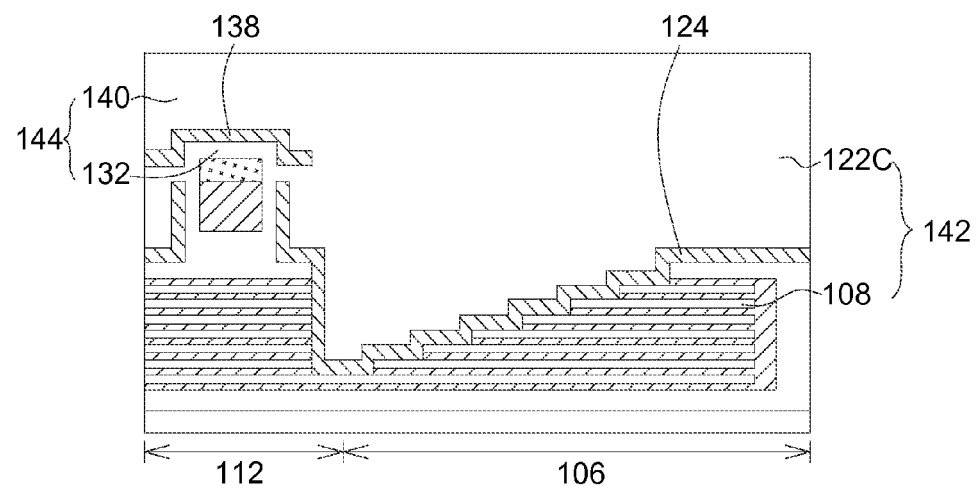

Referring to FIG. 1G, a dielectric material is formed on the upper dielectric portion 122b (FIG. 1F) in the first circuit region 106 and the dielectric layer 138 in the second circuit region 112, to form the upper dielectric portion 122C in the first circuit region 106, and an upper dielectric portion 140 in the second circuit region 112. The dielectric layer 124 has a material different from materials of the upper dielectric portion 122C and the lower dielectric portion 108 of a dielectric structure 142. The dielectric layer 138 has a material different from materials of the upper dielectric portion 140 and the lower dielectric portion 132 of a dielectric structure 144. In one embodiment, for example, the upper dielectric portions 122C, 140 and the lower dielectric portions 108, 132 comprise an oxide such as silicon oxide. The dielectric layers 124, 138 comprise a nitride such as silicon nitride.

Figure 1H:
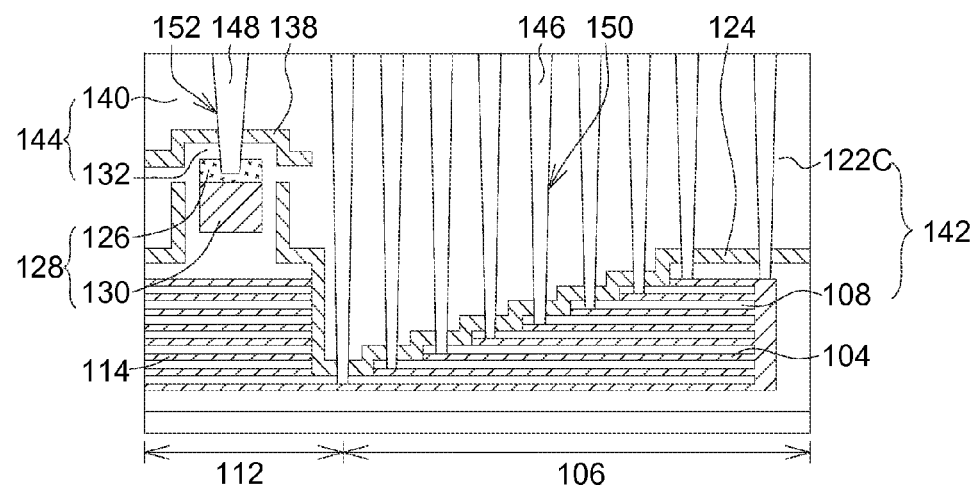

Referring to FIG. 1H, a first conductive plug 146 is formed to pass through only the upper dielectric portion 122C, the dielectric layer 124 and the lower dielectric portion 108, to physically and electrically contact with the first conductive structure 104. A second conductive plug 148 is formed to pass through only the upper dielectric portion 140, the dielectric layer 138 and the lower dielectric portion 132, to physically and electrically contact with the upper conductive portion 126 of the second conductive structure 128. In one embodiment, for example, the first conductive plug 146 has an aspect ratio or a height larger than an aspect ratio or a height of the second conductive plug 148. The first conductive plug 146 may have a high aspect ratio.

The first conductive plug 146 and the second conductive plug 148 may be formed by a method comprising forming through holes 150, 152 by etching processes and filling the through holes 150, 152 by a conductive material.

For example, through holes stopping on the dielectric layers 124, 138 may be formed by a first etching step using the same mask (not shown) to etch down from upper surfaces of the upper dielectric portion 122C and the upper dielectric portion 140 at the same time. Compared to the dielectric layers 124, 138, the first etching step has a higher etching selectivity to the upper dielectric portions 122C, 140, that is, the first etching step etches the upper dielectric portions 122C, 140 faster than the dielectric layers 124, 138, or etches none of the dielectric layers 124, 138 substantially (the similar concepts will not described hereafter). Therefore, in spite of the bigger thickness of the upper dielectric portion 122C than the upper dielectric portion 140, the first etching step and the through holes formed by the first etching step can stop on the dielectric layer 124 and the dielectric layer 138 in desire, and have desirable different aspect ratios or height.

Then, in one embodiment, the dielectric layers 124, 138 exposed by the through holes may be removed by a second etching step different from the first etching step to extend the through hole down to form through holes exposing the lower dielectric portions 108, 132. For example, compared to the upper dielectric portions 122C, 140 and the lower dielectric portions 108, 132, the second etching step may have a higher etching selectivity to the dielectric layers 124, 138. Therefore, the second etching step and the through holes formed by the second etching step can be controlled to stop on the lower dielectric portions 108, 132 in desire.

Next, in one embodiment, the lower dielectric portions 108, 132 exposed by the through holes may be removed by a third etching step different from the second etching step, to extend the through holes down to form a through hole 150 and a through hole 152 exposing the first conductive structure 104 and the second conductive structure 128 respectively. Compared to the dielectric layers 124, 138, the first conductive structure 104 and the second conductive structure 128, the third etching step has a higher etching selectivity to the lower dielectric portions 108, 132. Therefore, the third etching step and the through holes 150, 152 formed by the third etching step can be controlled to stop on the first conductive structure 104 and the second conductive structure 128 with desire.

For example, as the upper dielectric portions 122C, 140 have the same material with the lower dielectric portions 108, 132, the first etching step for removing the upper dielectric portions 122C, 140 and the third etching step for the lower dielectric portions 108, 132 may use the same etching conditions such as the same etching solution, etc.

In other embodiments, since the dielectric layer 124 and the lower dielectric portion 108 have thickness similar or substantially equal to thickness of the dielectric layer 138 and the lower dielectric portion 132, the second etching step for removing the dielectric layers 124, 138 may be continued after removing the dielectric layers 124, 138 to continuously remove the lower dielectric portions 108, 132. The second etching step can be controlled to stop on the first conductive structure 104 and the second conductive structure 128 by controlling an etching time or depending on etching selectivity to materials to be etched.

The semiconductor structure and the method for manufacturing for which may be varied according to the above concepts. Some examples are illustrated as following. For example, the upper dielectric portions 122C, 140 and the lower dielectric portions 108, 132 are not limited to an oxide, and the dielectric layers 124, 138 are not limited to a nitride. In other embodiments, materials for the upper dielectric portions 122C, 140, the lower dielectric portions 108, 132 and the dielectric layers 124, 138 may be suitably selected according to parameters of etching processes and etching selectivity characteristics to the materials. In some embodiments, the second conductive structure 128 and the first conductive structure 104 may be arranged in a similar or the same level by omitting the conductive strips 114 or reducing a number of the conductive strips 114 to be less than a number of the conductive stairs of the first conductive structure 104. In other embodiments, the first conductive plug 146 may be longer than or as long as the second conductive plug 148. The concepts of the embodiments can be applied to device of other kinds, needed to form conductive plugs electrically and physically contact with conductive structures of different structure characteristic and/or different levels (heights), respectively.

Figure 2:
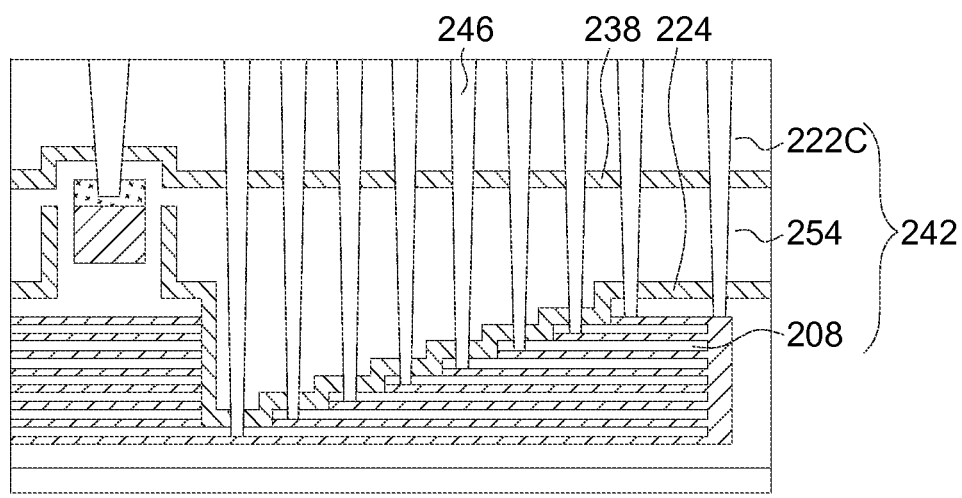
FIG. 2 illustrates a semiconductor structure according to a comparative example.

FIG. 2 illustrates a semiconductor structure according to a comparative example. Differences between the semiconductor structures of the comparative example and the embodiment are illustrated as following. In the comparative example, the first conductive plug 246 in sequence passes through an upper dielectric portion 222C, a dielectric layer 238, a middle dielectric portion 254, a dielectric layer 224, and a lower dielectric portion 208 to physically and electrically contact with the first conductive structure 104. For example, the upper dielectric portion 222C, the middle dielectric portion 254 and the lower dielectric portion 208 of a dielectric structure 242 comprises an oxide such as silicon oxide, and the dielectric layers 224, 238 comprise a nitride such as silicon. Compared to the semiconductor structure of the comparative example which need two necessary masks (one is for removing the upper dielectric portion 222C and the dielectric layer 238, and the other is for removing the middle dielectric portion 254, the dielectric layer 224 and the lower dielectric portion 208), the semiconductor structure of the embodiment as shown in FIG. 1A to FIG. 1H uses only one mask to etch out the through holes 150, 152 for forming the first conductive plug 146 and the second conductive plug 148, and need less etching processes and shorter manufacturing time. In addition, the mask for the embodiment can have a feature size lager (such as non-critical) than a feature size of the mask for the comparative example. Therefore, the semiconductor structure according to embodiments has low cost and high WPH.

While the invention has been described by way of example and in terms of the exemplary embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor structure, comprising:
   forming a first conductive structure on a substrate;
   forming a second conductive structure on the substrate, the second conductive structure comprising an upper conductive portion, wherein the upper conductive portion has a material different from a material of the first conductive structure;
   forming a lower dielectric portion of a dielectric structure on the first conductive structure and the second conductive structure;
   forming a dielectric layer on the lower dielectric portion;
   forming an upper dielectric portion of the dielectric structure on the dielectric layer, wherein the dielectric layer has a material different from materials of the upper dielectric portion and the lower dielectric portion;
   forming a first conductive plug passing through only the upper dielectric portion, the dielectric layer and the lower dielectric portion to physically and electrically contact with the first conductive structure; and
   forming a second conductive plug passing through the upper dielectric portion, the dielectric layer and the lower dielectric portion to physically and electrically contact with the second conductive structure;
   wherein the first conductive plug and the second conductive plug have different aspect ratios.

2. The method for manufacturing the semiconductor structure according to claim 1, wherein the second conductive plug passes through only the upper dielectric portion, the dielectric layer and the lower dielectric portion to physically and electrically contact with the second conductive structure.

3. The method for manufacturing the semiconductor structure according to claim 1, comprising:
   forming a silicon-containing structure;
   forming a first etching stop layer covering the lower dielectric portion in a first circuit region and the silicon-containing structure in a second circuit region;
   removing the first etching stop layer in the second circuit region to expose the silicon-containing structure and remain the first etching stop layer in the first circuit region to form the dielectric layer; and
   metalizing an exposed portion of the silicon-containing structure to form the upper conductive portion.

4. The method for manufacturing the semiconductor structure according to claim 1, comprising:
   forming a second etching stop layer covering the upper dielectric portion; and
   removing the second etching stop layer in a first circuit region and remain the second etching stop layer in a second circuit region to form the dielectric layer.

5. The method for manufacturing the semiconductor structure according to claim 1, wherein the first conductive plug and the second conductive plug are formed by a method comprising:
   removing a portion of the upper dielectric portion to form through holes by a first etching step stopping on the dielectric layer;
   removing the dielectric layer exposed by the through holes to extend the through holes down to expose the lower dielectric portion by a second etching step different from the first etching step and stopping on the lower dielectric portion;
   removing the lower dielectric portion exposed by the through holes to extend the through holes down to respectively expose the first conductive structure and the second conductive structure by a third etching step different from the second etching step; and
   filling the through holes by a conductive material to form the first conductive plug and the second conductive plug.

6. The method for manufacturing the semiconductor structure according to claim 5, wherein,
   the first etching step etches the upper dielectric portion faster than the dielectric layer,
   the second etching step etches the dielectric layer faster than the upper dielectric portion and the lower dielectric portion,
   the third etching step etches the lower dielectric portion faster than the dielectric layer.

7. The method for manufacturing the semiconductor structure according to claim 5, the through holes formed by the first etching step have different aspect ratios.

8. The method for manufacturing the semiconductor structure according to claim 5, wherein the through holes for the first conductive plug and the second conductive plug are defined by the same mask.

9. The method for manufacturing the semiconductor structure according to claim 1, wherein the first conductive plug and the second conductive plug are formed by a method comprising:
   removing a portion of the upper dielectric portion to form through holes by a first etching step stopping on the dielectric layer;
   removing the dielectric layer exposed by the through holes to extend the through holes down to expose the first conductive structure and the second conductive structure by a second etching step different from the first etching step and stopping on the first conductive structure and the second conductive structure; and
   filling the through holes by a conductive material to form the first conductive plug and the second conductive plug.

10. A semiconductor structure, comprising:
    a substrate;
    a first conductive structure on the substrate;
    a second conductive structure on the substrate, the second conductive structure comprising an upper conductive portion, wherein the upper conductive portion has a material different from the first conductive structure;
    a dielectric structure comprising an upper dielectric portion and a lower dielectric portion;
    a dielectric layer between the upper dielectric portion and the lower dielectric portion, and having a material different from materials of the upper dielectric portion and the lower dielectric portion;

a first conductive plug passing through only the upper dielectric portion, the dielectric layer and the lower dielectric portion to physically and electrically contact with the first conductive structure; and a second conductive plug passing through the upper dielectric portion, the dielectric layer and the lower dielectric portion to physically and electrically contact with the second conductive structure;

wherein the first conductive plug and the second conductive plug have different aspect ratios.

11. The semiconductor structure according to claim 10, wherein an aspect ratio of the first conductive plug is larger than an aspect ratio of the second conductive plug.

12. The semiconductor structure according to claim 10, comprising a first circuit region and a second circuit region, wherein the first circuit region and the second circuit region are non-overlapping, the first conductive structure and the first conductive plug are disposed in the first circuit region, the second conductive structure and the second conductive plug are disposed in the second circuit region.

13. The semiconductor structure according to claim 12, wherein the upper dielectric portion in the first circuit region is thicker than the upper dielectric portion in the second circuit region.

14. The semiconductor structure according to claim 12, comprising a plurality the first conductive plug, wherein the first conductive structure comprises conductive stairs of different levels, the first conductive plugs separated from each other physically and electrically contact the conductive stairs.

15. The semiconductor structure according to claim 10, wherein the first conductive structure comprises polysilicon, the upper conductive portion of the second conductive structure comprises a metal silicide.

16. The semiconductor structure according to claim 10, wherein the second conductive structure comprises a lower conductive portion under the upper conductive portion and physically connecting with the upper conductive portion comprising a metal silicide, the lower conductive portion comprises polysilicon.

17. The semiconductor structure according to claim 10, wherein the upper dielectric portion and the lower dielectric portion of the dielectric structure comprise an oxide, the dielectric layer comprises a nitride.

18. The semiconductor structure according to claim 10, wherein the second conductive plug passing through only the upper dielectric portion, the dielectric layer and the lower dielectric portion.

19. The semiconductor structure according to claim 10, wherein the first conductive plug and the second conductive plug have different lengths.

* * * * *